(12) United States Patent
Leobandung

(10) Patent No.: US 11,695,005 B2
(45) Date of Patent: Jul. 4, 2023

(54) FABRICATING GATE-ALL-AROUND TRANSISTORS HAVING HIGH ASPECT RATIO CHANNELS AND REDUCED PARASITIC CAPACITANCE

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 185 days.

(21) Appl. No.: 17/194,765

(22) Filed: Mar. 8, 2021

(65) Prior Publication Data

US 2021/0210487 A1    Jul. 8, 2021

Related U.S. Application Data

(62) Division of application No. 16/455,892, filed on Jun. 28, 2019, now Pat. No. 10,998,311.

(51) Int. Cl.
| | | |
|---|---|---|
| H01L 21/70 | (2006.01) | |
| H01L 27/088 | (2006.01) | |
| H01L 29/78 | (2006.01) | |
| H01L 29/66 | (2006.01) | |
| H01L 21/8234 | (2006.01) | |
| H01L 29/10 | (2006.01) | |

(52) U.S. Cl.
CPC .. H01L 27/0886 (2013.01); H01L 21/823412 (2013.01); H01L 21/823431 (2013.01); H01L 21/823481 (2013.01); H01L 29/1033 (2013.01); H01L 29/66545 (2013.01); H01L 29/66795 (2013.01); H01L 29/785 (2013.01)

(58) Field of Classification Search
CPC ......... H01L 27/2886; H01L 21/823412; H01L 21/823431; H01L 21/823481; H01L 29/66795
USPC .................................................. 257/368
See application file for complete search history.

(56) References Cited

U.S. PATENT DOCUMENTS

| | | |
|---|---|---|
| 8,994,081 B2 | 3/2015 | Leobandung |
| 9,252,275 B2 | 2/2016 | Rachmady et al. |
| 9,590,089 B2 | 3/2017 | Rachmady et al. |
| 9,991,261 B2 | 6/2018 | Mitard |
| 2016/0190289 A1 | 6/2016 | Akarvardar et al. |
| 2016/0190312 A1 | 6/2016 | Zhang et al. |

(Continued)

FOREIGN PATENT DOCUMENTS

EP    1244142 A1    9/2002

OTHER PUBLICATIONS

Khan et al., "Self-consistent Capacitance-Voltage Characterization of Gate-all-around Graded Nanowire Transistor," arXiv preprint arXiv:1406.5257, 2014, 4 pages.

(Continued)

*Primary Examiner* — Phuc T Dang
(74) *Attorney, Agent, or Firm* — Cantor Colburn LLP; Robert Sullivan

(57) ABSTRACT

Embodiments of the invention are directed to a semiconductor-based structure. A non-limiting example of the semiconductor-based structure includes a fin formed over a substrate. A tunnel is formed through the fin to define an upper fin region and a lower fin region. A gate structure is configured to wrap around a circumference of the upper fin region.

20 Claims, 10 Drawing Sheets

(56) References Cited

U.S. PATENT DOCUMENTS

| | | |
|---|---|---|
| 2016/0308032 A1 | 10/2016 | Glass et al. |
| 2017/0317187 A1 | 11/2017 | Gardner et al. |
| 2018/0019241 A1* | 1/2018 | Brunco ............... H01L 29/1083 |
| 2018/0226490 A1 | 8/2018 | Le et al. |
| 2019/0139955 A1 | 5/2019 | Kim et al. |
| 2019/0304841 A1* | 10/2019 | Sung ............... H01L 21/823431 |
| 2020/0411512 A1 | 12/2020 | Leobandung |

OTHER PUBLICATIONS

List of IBM Patents or Patent Applications Treated as Related; Date Filed: Mar. 8, 2021, 2 pages.

* cited by examiner

FABRICATING GATE-ALL-AROUND TRANSISTORS HAVING HIGH ASPECT RATIO CHANNELS AND REDUCED PARASITIC CAPACITANCE

BACKGROUND

The present invention relates in general to fabrication methods and resulting structures for semiconductor devices. More specifically, the present invention relates to fabrication methods and resulting structures for gate-all-around transistors having high aspect-ratio channels and reduced parasitic capacitance.

In contemporary semiconductor device fabrication processes, a large number of semiconductor devices, such as n-type field effect transistors (nFETs) and p-type field effect transistors (pFETs), are fabricated on a single wafer. Non-planar transistor device architectures, such as nanosheet (or nanowire) transistors, can provide increased device density and increased performance over planar transistors. Nanosheet-based transistors, in contrast to conventional planar FETs, include a gate stack that wraps around the full perimeter of multiple nanosheet channel regions for improved control of channel current flow. Hence, nanosheet-based transistors are often referred to as gate-all-around (GAA) transistors. Nanosheet-based GAA transistor configurations enable full depletion in the nanosheet channel regions and reduce short-channel effects.

SUMMARY

Embodiments of the invention are directed to a method of fabricating a semiconductor device. A non-limiting example of the method includes forming a fin over a substrate. The fin includes an upper fin region and a lower fin region. The lower fin region is physically coupled to the upper fin region and the substrate. A portion of the fin is removed to form a fin tunnel configured to physically separate the upper fin region from the lower fin region. A gate structure is formed and configured to fill the fin tunnel and cover a top surface, a bottom surface, a first sidewall, and a second sidewall of the upper fin region.

Embodiments of the invention are directed to a method of fabricating a semiconductor device. A non-limiting example of the method includes forming a first fin and a second fin over a substrate. The first fin includes an upper first fin region and a lower first fin region. The lower first fin region is physically coupled to the upper first fin region and the substrate. The second fin includes an upper second fin region and a lower second fin region. The lower second fin region is physically coupled to the upper second fin region and the substrate. A portion of the first fin is removed to form a first fin tunnel configured to physically separate the upper first fin region from the lower first fin region. A portion of the second fin is removed to form a second fin tunnel configured to physically separate the upper second fin region from the lower second fin region. A gate structure is formed and configured to fill the first fin tunnel; fill the second tunnel; cover a top surface, a bottom surface, a first sidewall, and a second sidewall of the upper first fin region; and cover a top surface, a bottom surface, a first sidewall, and a second sidewall of the upper second fin region.

Embodiments of the invention are directed to a semiconductor-based structure. A non-limiting example of the semiconductor-based structure includes a first fin and a second fin formed over a substrate. A tunnel is formed through the fin to define an upper fin region and a lower fin region. A gate structure is configured to wrap around a circumference of the upper fin region.

Embodiments of the invention are directed to a semiconductor-based structure. A non-limiting example of the semiconductor-based structure includes a first fin and a second fin formed over a substrate. A first fin tunnel extends through the first fin to define an upper first fin region and a lower first fin region. A second fin tunnel extends through the second fin to define an upper second fin region and a lower second fin region. A gate structure is configured to wrap around a circumference of the upper first fin region and a circumference of the upper second fin region.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 1-10 depict a portion of an IC having formed thereon a GAA-based structure, wherein the GAA-based structure is after various fabrication operations for forming a GAA FET having high aspect-ratio channels and reduced parasitic capacitance in accordance with aspects of the invention, in which:

FIG. 1 depicts a top-down view, a view along line A-A of the top-down view, and a view along line B-B of the top-down view of the GAA-based structure after initial fabrication operations in accordance with aspects of the invention;

FIG. 2 depicts a top-down view, a view along line A-A of the top-down view, and a view along line B-B of the top-down view of the GAA-based structure after additional fabrication operations in accordance with aspects of the invention;

FIG. 3 depicts a top-down view, a view along line A-A of the top-down view, and a view along line B-B of the top-down view of the GAA-based structure after additional fabrication operations in accordance with aspects of the invention;

FIG. 4 depicts a top-down view, a view along line A-A of the top-down view, and a view along line B-B of the top-down view of the GAA-based structure after additional fabrication operations in accordance with aspects of the invention;

FIG. 5 depicts a top-down view, a view along line A-A of the top-down view, and a view along line B-B of the top-down view of the GAA-based structure after additional fabrication operations in accordance with aspects of the invention;

FIG. 6 depicts a view along line A-A of the top-down view of the GAA-based structure shown in FIGS. 1-5, along with a view along line B-B of the top-down view of the GAA-based structure shown in FIGS. 1-5 after additional fabrication operations in accordance with aspects of the invention;

FIG. 7 depicts a view along line A-A of the top-down view of the GAA-based structure shown in FIGS. 1-5, along with a view along line B-B of the top-down view of the GAA-based structure shown in FIGS. 1-5 after additional fabrication operations in accordance with aspects of the invention;

FIG. 8 depicts a view along line A-A of the top-down view of the GAA-based structure shown in FIGS. 1-5, along with a view along line B-B of the top-down view of the GAA-based structure shown in FIGS. 1-5 after additional fabrication operations in accordance with aspects of the invention;

FIG. 9 depicts a view along line A-A of the top-down view of the GAA-based structure shown in FIGS. 1-5, along with a view along line B-B of the top-down view of the GAA-based structure shown in FIGS. 1-5 after additional fabrication operations in accordance with aspects of the invention; and FIG. 10 depicts a view along line A-A of the top-down view of the GAA-based structure shown in FIGS. 1-5, along with a view along line B-B of the top-down view of the GAA-based structure shown in FIGS. 1-5 after additional fabrication operations in accordance with aspects of the invention.

DETAILED DESCRIPTION

Figure 1:
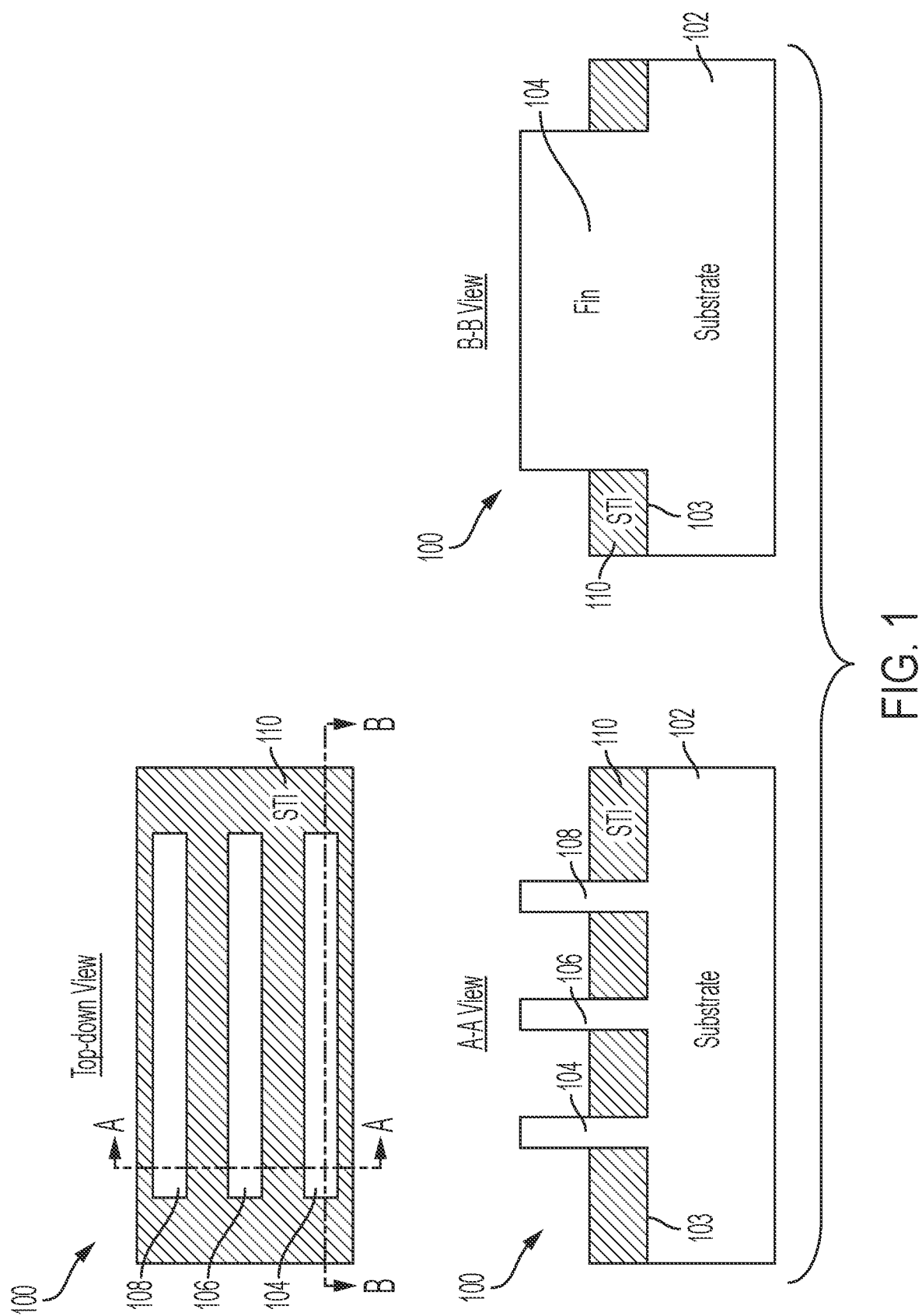

It is understood in advance that although this invention includes a detailed description of exemplary gate-all-around (GAA) nanosheet FET architectures having silicon (Si) high aspect-ratio channel(s), embodiments of the invention are not limited to the particular FET architectures, fabrication methods, or materials described in this specification. Rather, embodiments of the present invention are capable of being implemented in conjunction with any other type of GAA FET architecture, fabrication methods, or materials now known or later developed configured and arranged to incorporate claimed aspects of the invention.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

It is desirable to increase the electrical conductivity of a transistor's channel material. A known method of increasing channel conductivity is to form the channel region as a series of nanosheets. A known nanosheet-based FET architecture includes a source region, a drain region and stacked nanosheet channels between the source and drain regions. A gate surrounds the stacked nanosheet channels and regulates electron flow through the nanosheet channels between the source and drain regions. Hence, nanosheet-based FET devices are also known as gate-all-around (GAA) nanosheet FETs. In general, nanosheet-based GAA FETs can be fabricated by forming alternating layers of channel nanosheets and sacrificial nanosheets. The sacrificial nanosheets are released from the channel nanosheets and replaced with the gate structure when the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-type FET can be SiGe or Si, and the sacrificial nanosheets can be Si or SiGe.

Although nanosheet-based GAA FET architectures provide increased channel conductivity over planar FET architectures, there are still challenges when attempting to fabricate nanosheet-based GAA FETs that provide the performance characteristics required for a particular application. For example, while bulk substrates, when compared to silicon-on-insulator (SOI) substrates, offer low cost, fabricating a nanosheet-based GAA transistor on a bulk substrate can result in difficulties in controlling transistor characteristics such as unwanted parasitic capacitance. When starting with a bulk substrate, parasitic capacitance can occur between the substrate and source/drain and channel regions that are not isolated from the substrate. Parasitic capacitance degrades circuit performance and consumes power.

Turning now to an overview of aspects of the invention, embodiments of the invention provide fabrication methods and resulting structures for novel GAA transistor architectures having high aspect-ratio channels and reduced parasitic capacitance. A method of forming a novel GAA transistor architecture in accordance with aspects of the invention includes forming an elongated, high aspect-ratio fin over a substrate. A section of the fin is removed to form a tunnel that extends through the fin and separates the fin into an active upper fin region and an inactive lower fin region. A gate structure is formed that wraps around the active upper fin region. Source or drain (S/D) regions are formed at ends of the active upper fin region such that the active upper fin region functions as a transistor channel. Because the active upper fin channel is elongated (i.e., the fin's horizontal length in one cross-section is greater than its horizontal width in another cross-section) and has a high aspect-ratio (i.e., a fin cross-section is taller than it is wide), and because the gate structure is over and around a top surface, a bottom surface, and sidewalls of the active upper fin channel, electrical conductivity of the channel region formed by the active upper fin region is increased. Additionally, in the novel GAA transistor described herein, the parasitic coupling between the gate structures, the substrate, and the S/D regions are reduced, which improve the performance of the GAA transistor device.

A method of forming a novel GAA transistor architecture in accordance with aspects of the invention can also include forming multiple elongated, high aspect-ratio fins over a substrate. A section of each fin is removed to form a tunnel that extends through each fin and separates each fin into an active upper fin region and an inactive lower fin region. A gate structure is formed that wraps around the multiple active upper fin regions. Source or drain (S/D) regions are formed at ends of the multiple active upper fin regions such that the multiple active upper fin regions function collectively as a transistor channel. Because each of the multiple active upper fin channels is elongated (i.e., the fin's horizontal length in one cross-section is greater than its horizontal width in another cross-section) and has a high aspect-ratio (i.e., a fin cross-section is taller than it is wide), and because the gate structure is over and around a top surface, a bottom surface, and sidewalls of each of the multiple active upper fin channels, electrical conductivity of the channel regions formed by the multiple active upper fin regions is increased. Additionally, in the novel GAA transistor described herein, the parasitic coupling between the gate structures, the substrate, and S/D regions are reduced, which improve the performance of the GAA transistor device.

Turning now to a more detailed description of fabrication operations according to aspects of the invention, FIGS. 1-10 depict multiple views of a portion of an IC 100 having formed thereon a GAA-based structure, which is depicted in each figure after various fabrication operations have been performed to form a GAA FET having high aspect-ratio channels and reduced parasitic capacitance in accordance with aspects of the invention. More specifically, FIG. 1 depicts a top-down view, a view along line A-A, and a view along line B-B of the IC 100 after initial fabrication operations in accordance with aspects of the invention. As best shown in the A-A view, the initial IC 100 has been fabricated to include a semiconductor substrate 102, fins 104, 106, 108, and a shallow trench isolation (STI) region 110, configured and arranged as shown. The fins 104, 106, 108 are each elongated (best shown in the top-down view and the B-B view) and have a high aspect-ratio (taller than wide) cross-section (best shown in the A-A view). Three fins 104, 106, 108 are shown in FIG. 1 for ease of illustration and explanation. However, any number of fins (one, two, three, four, etc.) can be provided. In some embodiments of the invention, only one fin is provided. In some embodiments of the invention, multiple fins are provided.

Known fabrication operations can be sued to form the IC 100 shown in FIG. 1. For example, the substrate 102 can be a bulk semiconductor material, and the fins 104, 106, 108 can be formed in the bulk semiconductor material by depositing a hard mask layer (e.g., SiN) (not shown) over the bulk semiconductor material. A patterned resist (not shown) is deposited over hard mask layer to pattern the fins 104, 106, 108. An etch operation (e.g., an anisotropic etch) is applied to the patterned resist to form the fins 104, 106, 108 in the bulk semiconductor material. In an example fabrication method, fins are formed everywhere on the bulk semiconductor material, and the fins that are not needed in the final IC design are removed, resulting in groupings (or sets) of fins (e.g., fins 104, 106, 108) formed in the substrate 102. The etch operation also forms a major surface 103 of the substrate 102. The substrate 102 can be made of any suitable substrate material, such as, for example, monocrystalline Si, SiGe, SiC, III-V compound semiconductor, II-VI compound semiconductor, or semiconductor-on-insulator (SOI). A local oxide (e.g., $SiO_2$) is deposited between fins 104, 106, 108 and over the major surface 103 of the substrate 102. The local oxide is polished and recessed back to form the STI regions 110, and to expose upper portions (or active regions) of the fins 104, 106, 108.

Figure 2:
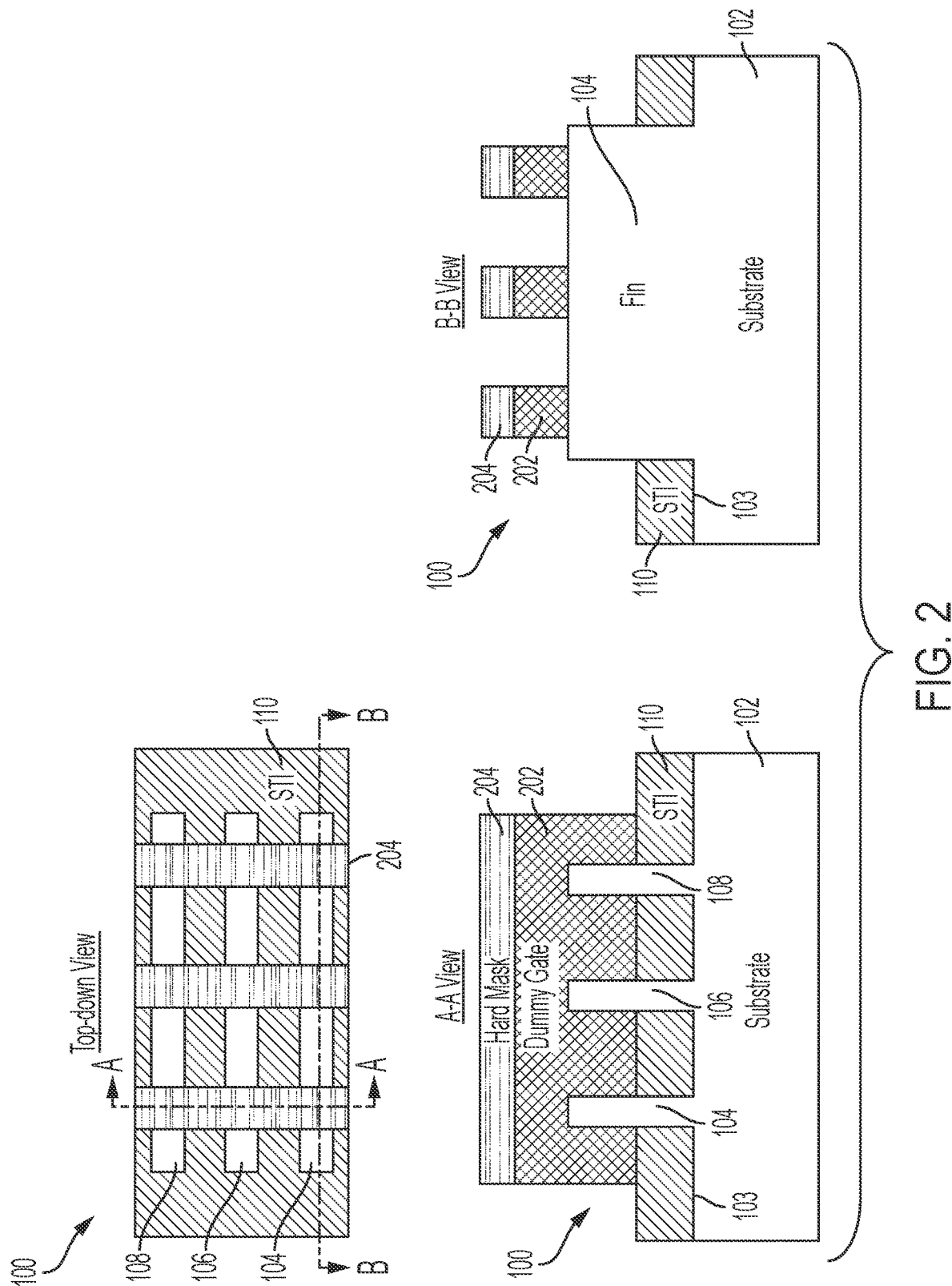

FIG. 2 depicts a top-down view, a view along line A-A, and a view along line B-B of the IC 100 after additional fabrication operations in accordance with aspects of the invention. More specifically, as best shown in the A-A view, known fabrication operations have been used to form a dummy gates 202 and hard masks (or caps) 204 that extend over and around the elongated, high aspect-ratio fins 104, 106, 108. The dummy gates 202 can be formed by depositing amorphous silicon (a-Si) over and around the fins 104, 106, 108. The a-Si is planarized to a desired level. A hard mask layer (not shown) is deposited over the planarized a-Si and patterned to form the hard masks 204. In embodiments of the invention, the hard masks 204 can be formed from a nitride or an oxide layer. An etching process (e.g., an RIE) is applied to the a-Si to form the dummy gates 202.

Figure 3:
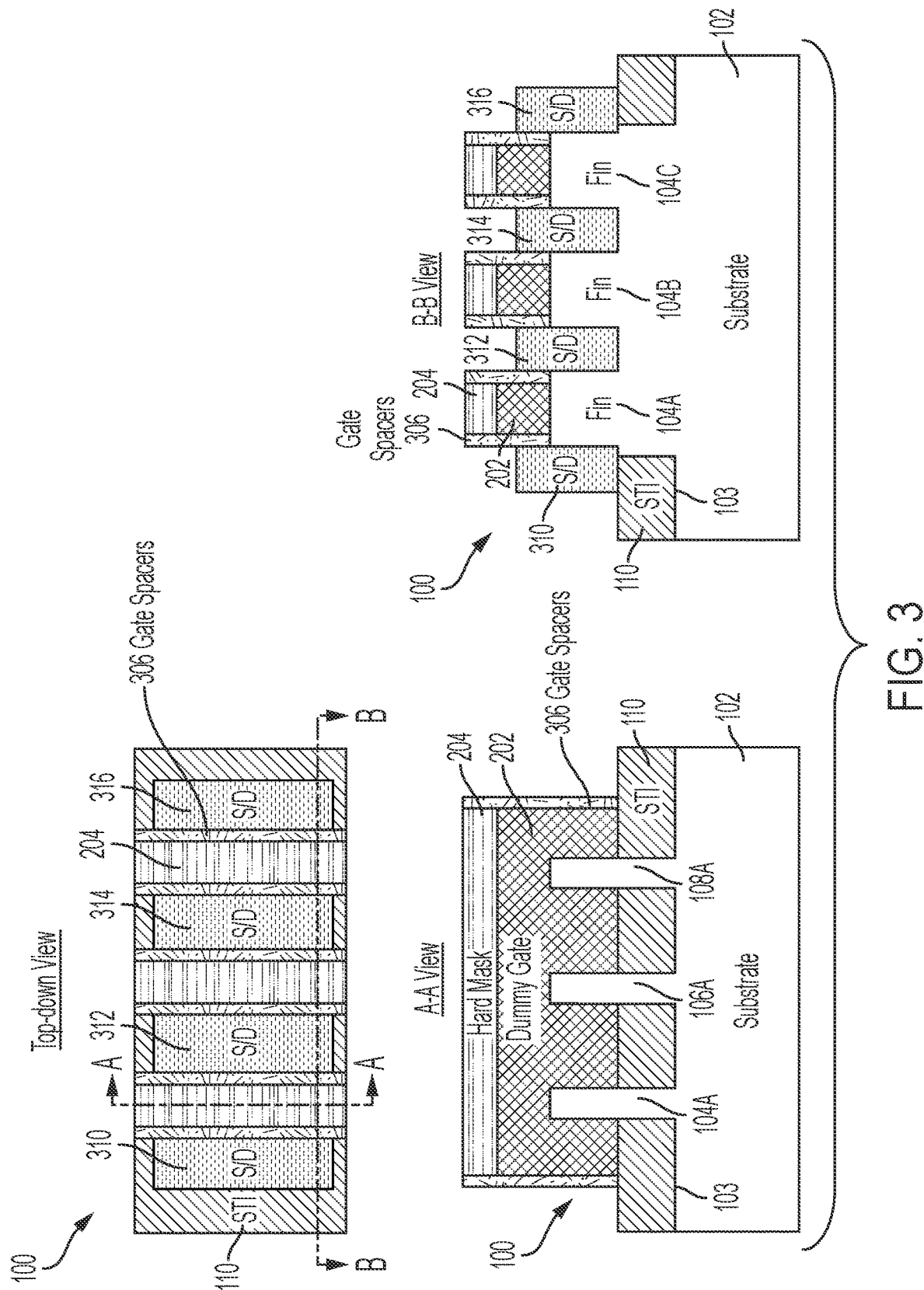

FIG. 3 depicts a top-down view, a view along line A-A, and a view along line B-B of the IC 100 after additional fabrication operations in accordance with aspects of the invention. More specifically, as best shown in the A-A view, known semiconductor fabrication operations have been used to form offset gate spacers 306. In embodiments of the invention, the offset gate spacers 306 can be formed using a spacer pull down formation process. The offset gate spacers 306 can also be formed by a conformal deposition of a dielectric material (e.g., silicon oxide, silicon nitride, silicon oxynitride, SiBCN, SiOCN, SiOC, or any suitable combination of those materials) followed by a directional etch (e.g., RIE).

Referring still to FIG. 3, as best shown in the B-B view, known fabrication operations have also been used to form doped S/D regions 310, 312, 314, 316 in or over the portions of the fins 104, 106, 108 (shown in FIG. 2) that are not covered by the dummy gates 202 and gate spacers 204. More specifically, and with specific reference to the B-B view of FIG. 3, after fabrication of the doped S/D regions 310, 312, 314, 316, the fin 104 (shown in the B-B view of FIG. 2) is converted into the doped S/D regions 310, 312, 314, 316 and three fins 104A, 104B, 104C. In aspects of the invention, the doped S/D regions 310, 312, 314, 316 can be formed in/on the fin 104 by injecting the appropriate dopants (n-type or p-type dopants) into the portions of the fin 104 that are not covered by the dummy gates 202 and gate spacers 204. In aspects of the invention, the doped S/D regions 310, 312, 314, 316 can be formed over the fin 104 by epitaxially growing the in-situ doped S/D regions 310, 312, 314, 316 (also known as raised S/D regions) on the portions of the fin 104 that are not covered by the dummy gates 202 and gate spacers 204. The same fabrication operations shown in the B-B view of FIG. 3 are applied to the fins 106, 108, thus forming in fins 106, 108 structures that correspond to the structures formed in fin 104 and shown in the B-B view of FIG. 3.

As best shown in the B-B view of FIG. 3, the IC 100 depicts one end of what will be three transistors coupled in series and having shared S/D regions. More specifically, a leftmost transistor is, at this fabrication stage, the dummy gate 202, the S/D regions 310, 312, and the fin 104A; a central transistor is, at this fabrication stage, the dummy gate 202, the S/D regions 312, 314, and the fin 104B; and a rightmost transistor is, at this fabrication stage, the dummy gate 202, the S/D regions 314, 316, and the fin 104C. The leftmost transistor shares S/D region 312 with the central transistor, and the rightmost transistor shares the S/D region 314 with the central transistor.

The A-A cross-sectional view of FIG. 3 depicts a portion of the leftmost transistor shown in the B-B view of FIG. 3. The leftmost transistor, at this fabrication stage, includes the dummy gate 202 and the fins 104A, 106A, 108A. The central transistor and the rightmost transistor (not shown in the A-A view of FIG. 3) have substantially the same construction as the leftmost transistor shown in the A-A view of FIG. 3.

Figure 4:
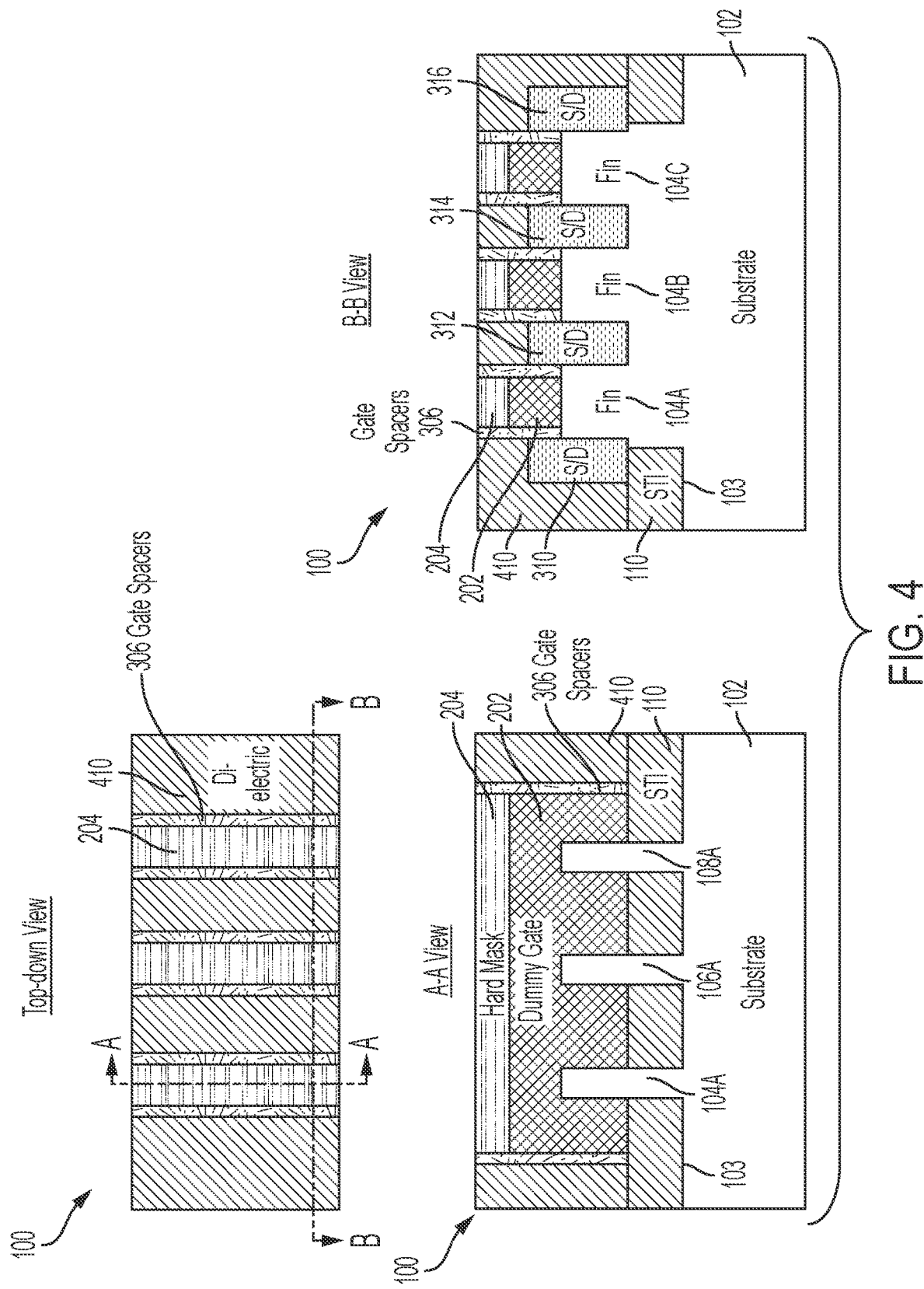

FIG. 4 depicts a top-down view, a view along line A-A, and a view along line B-B of the IC 100 after additional fabrication operations in accordance with aspects of the invention. As best shown in the A-A and B-B views, known fabrication operations have been used to deposit and planarize a dielectric fill material 410 over the IC 100 according to embodiments of the invention. In aspects of the invention, the dielectric fill 410 can be any suitable oxide, including, for example, $SiO_2$. In some embodiments of the invention, the dielectric fill 410 can be the same as or different from the STI regions 110.

Figure 5:
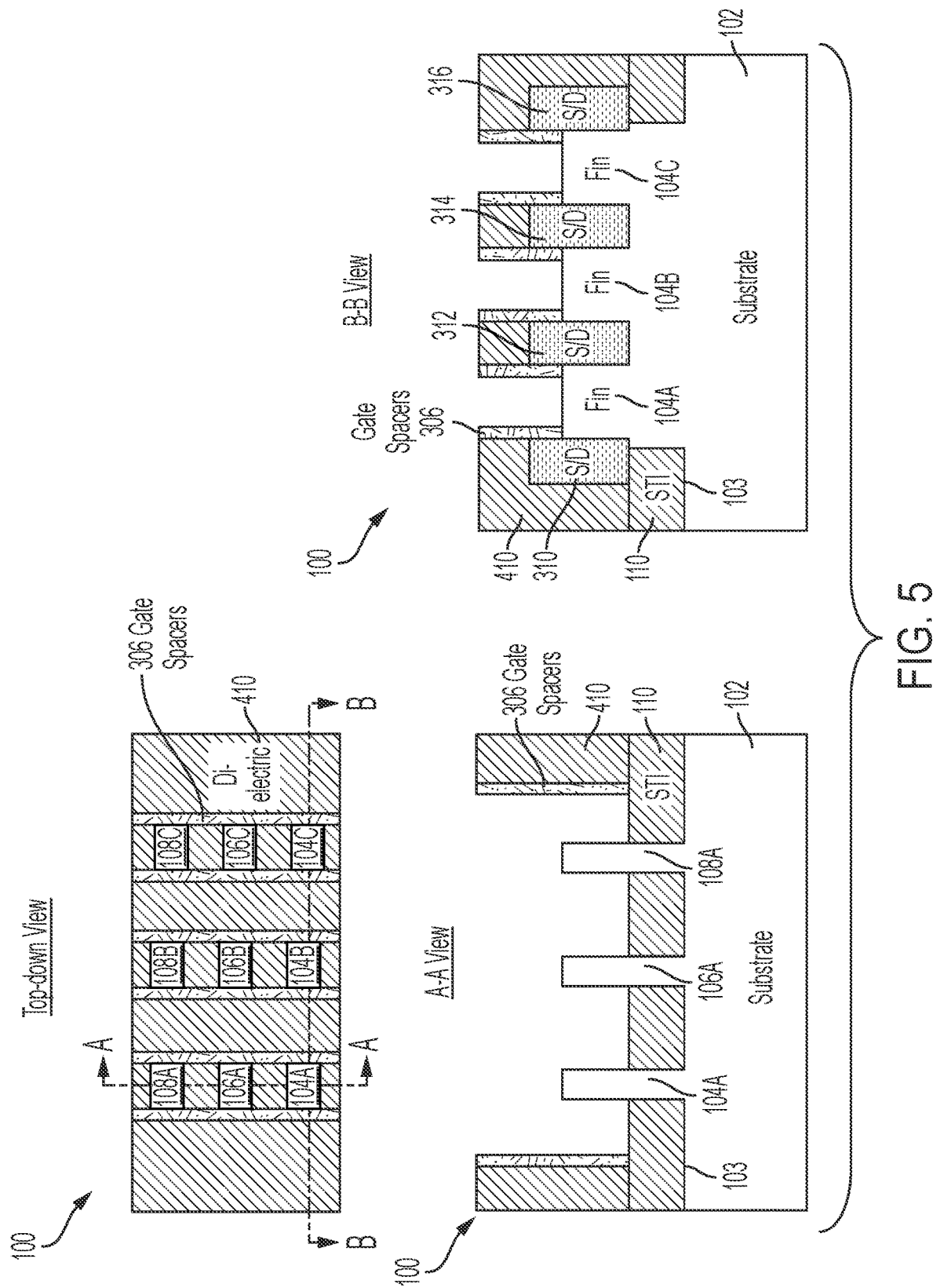

FIG. 5 depicts a top-down view, a view along line A-A, and a view along line B-B of the IC 100 after additional fabrication operations in accordance with aspects of the invention. As best shown in the A-A and B-B views, known semiconductor fabrication operations (e.g., replacement metal gate (RMG) processes) have been used remove the dummy gates 202 and the hard masks 204 using, for example, a known etching process, e.g., RIE or chemical oxide removal (COR).

Figure 6:
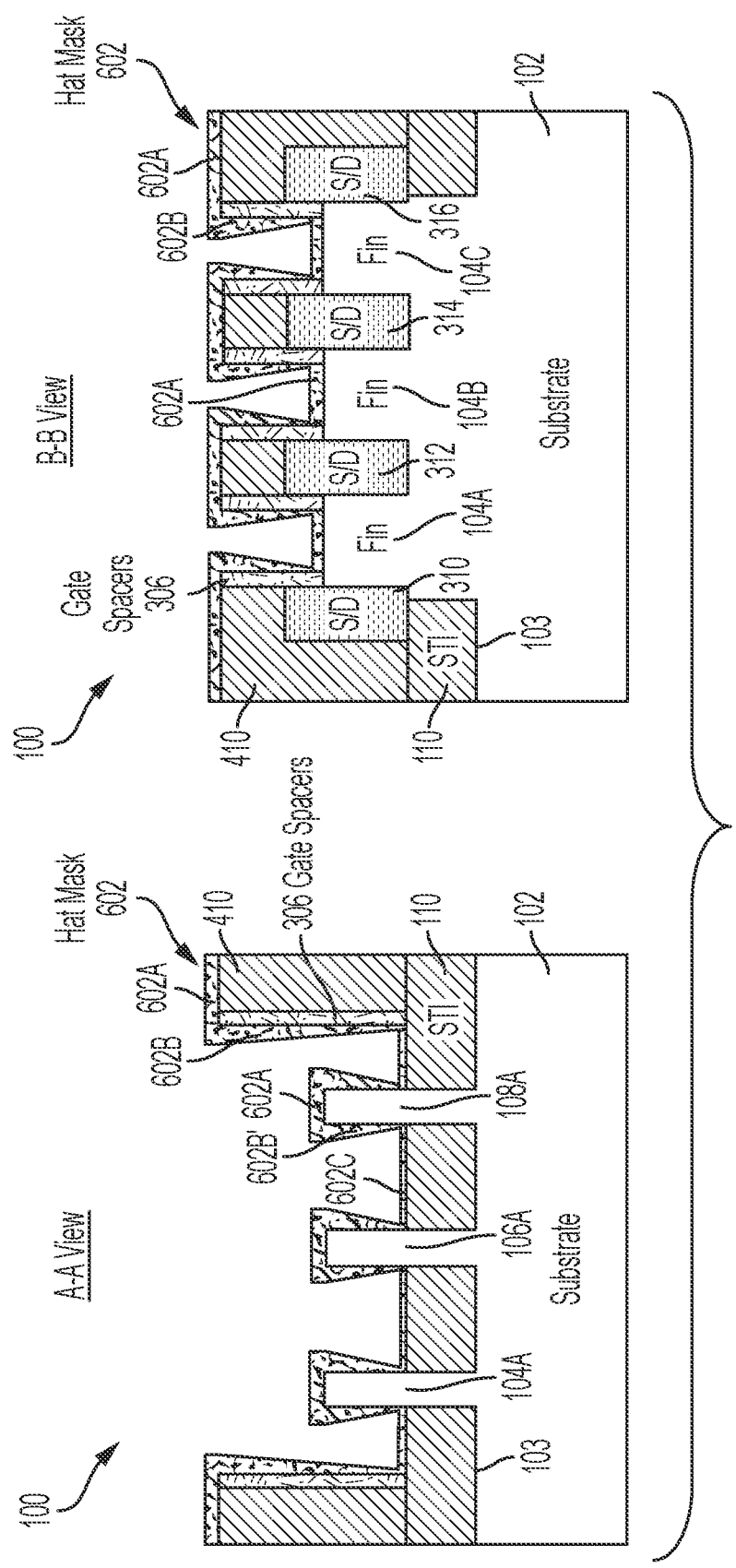

FIG. 6 depicts views along lines A-A and B-B of the IC 100 after additional fabrication operations in accordance with aspects of the invention. As best shown in the A-A and B-B views, and in accordance with aspects of the invention, known semiconductor fabrication operations (e.g., conformal depositions with selective directional etching) have been used to deposit a mask 602 having varying sections and thicknesses. More specifically, the mask 602 (referred to herein as a "hat mask" because of its cross-sectional profile) includes substantially uniform horizontal segments 602A, 602C and substantially tapered vertical segments 602B, 602B', configured and arranged as shown. In a non-limiting example, each of the horizontal mask segments 602A has a thickness of about 5 nm; each of the horizontal mask segments 602C has a thickness of about 3 nm; and each of the vertical mask segments 602B, 602B' has a thickness that tapers from about 5 nm at the top of the vertical mask segment 602B, 602B' to about 2 nm at the bottom of the vertical mask segment 602B, 602B'. The hat mask 602 can be formed by depositing partially conformal film that deposit thicker on top of the FIN vs. the bottom of the FIN. Deposition process such as Plasma Enhanced Chemical Vapor Deposition (PECVD) or other deposition processes can be used.

Figure 7:
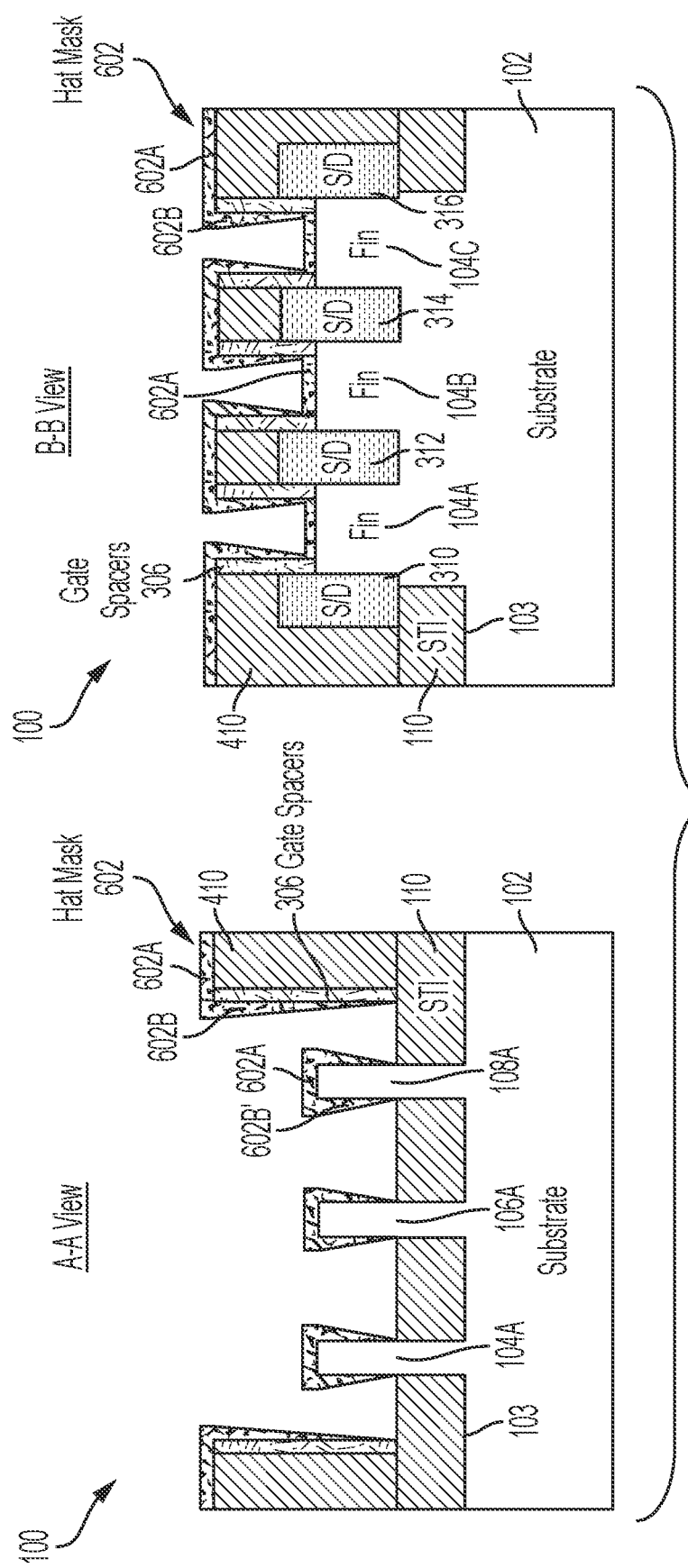

FIG. 7 depicts views along lines A-A and B-B of the IC 100 after additional fabrication operations in accordance with aspects of the invention. As best shown in the A-A and B-B views, and in accordance with aspects of the invention, known semiconductor fabrication operations (e.g., selective directional etching) have been used to etch about 3 nm of material from the horizontal segments 602A, 602C and the tapered vertical segments 602B, 602B'. Continuing with the non-limiting example described in connection with FIG. 6, after the etch operations depicted in FIG. 7, each of the horizontal mask segments 602A has a thickness of about 2 nm; each of the horizontal mask segments 602C has a thickness of about zero (0) nm; each of the vertical mask segments 602B has a thickness that tapers from about 2 nm at the top of the vertical mask segment 602B to about zero (0) nm at the bottom of the vertical mask segment 602B; and each of the vertical mask segments 602B' has a thickness that tapers from about 2 nm at the top of the vertical mask segment 602B' to about zero (0) nm at the bottom of the vertical mask segment 602B', thereby exposing bottom sidewall portions of the fins 104A, 106A, 108A. Similar bottom sidewall portions are exposed on the fin segments positioned behind the fins 104A, 106A, 108A. For example, the B-B view in FIG. 7 shows that fins 104B, 104C are positioned behind the fin 104A.

Figure 8:
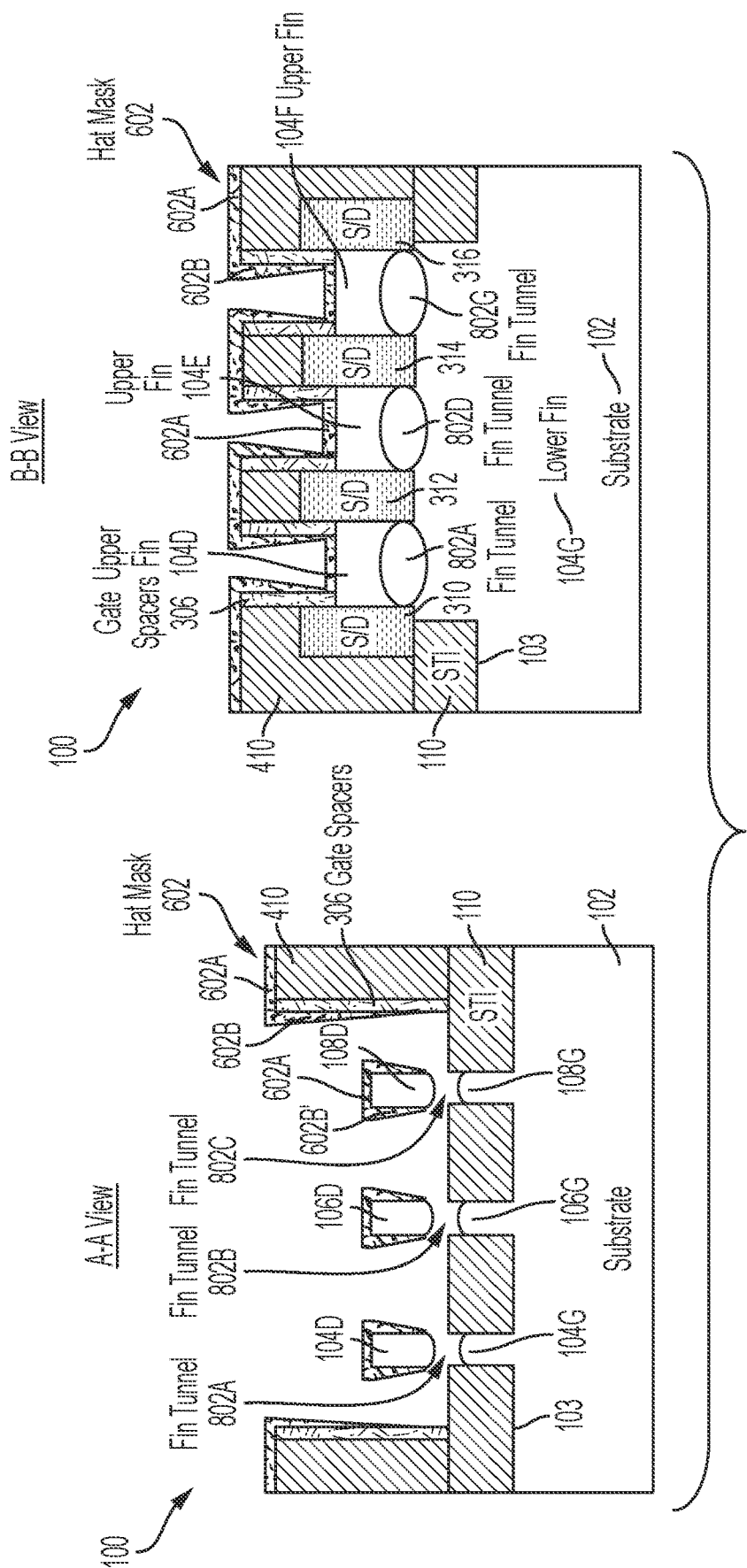

FIG. 8 depicts views along lines A-A and B-B of the IC 100 after additional fabrication operations in accordance with aspects of the invention. As best shown in the A-A and B-B views, and in accordance with aspects of the invention, known semiconductor fabrication operations (e.g., selective wet etching) have been used to selectively etch through the exposed bottom sidewall portions of the fins 104A, 104B, 104C, 106A, 108A (as well as the exposed bottom sidewall portions of the fin segment that are not visible in FIG. 8) to remove portions of the fins 104A, 104B, 104C, 106A, 108A (as well as portions of the fin segment that are not visible in FIG. 8), thereby forming fin tunnels 802A, 802B, 802C, 802D, 802G, active upper fin regions 104D, 104E, 104F, 106D, 108D, and inactive lower fin regions 104G, 106G, 108G. Corresponding fin tunnels are formed on the fin structures that are not shown in the A-A and B-B views of FIG. 8.

Figure 9:
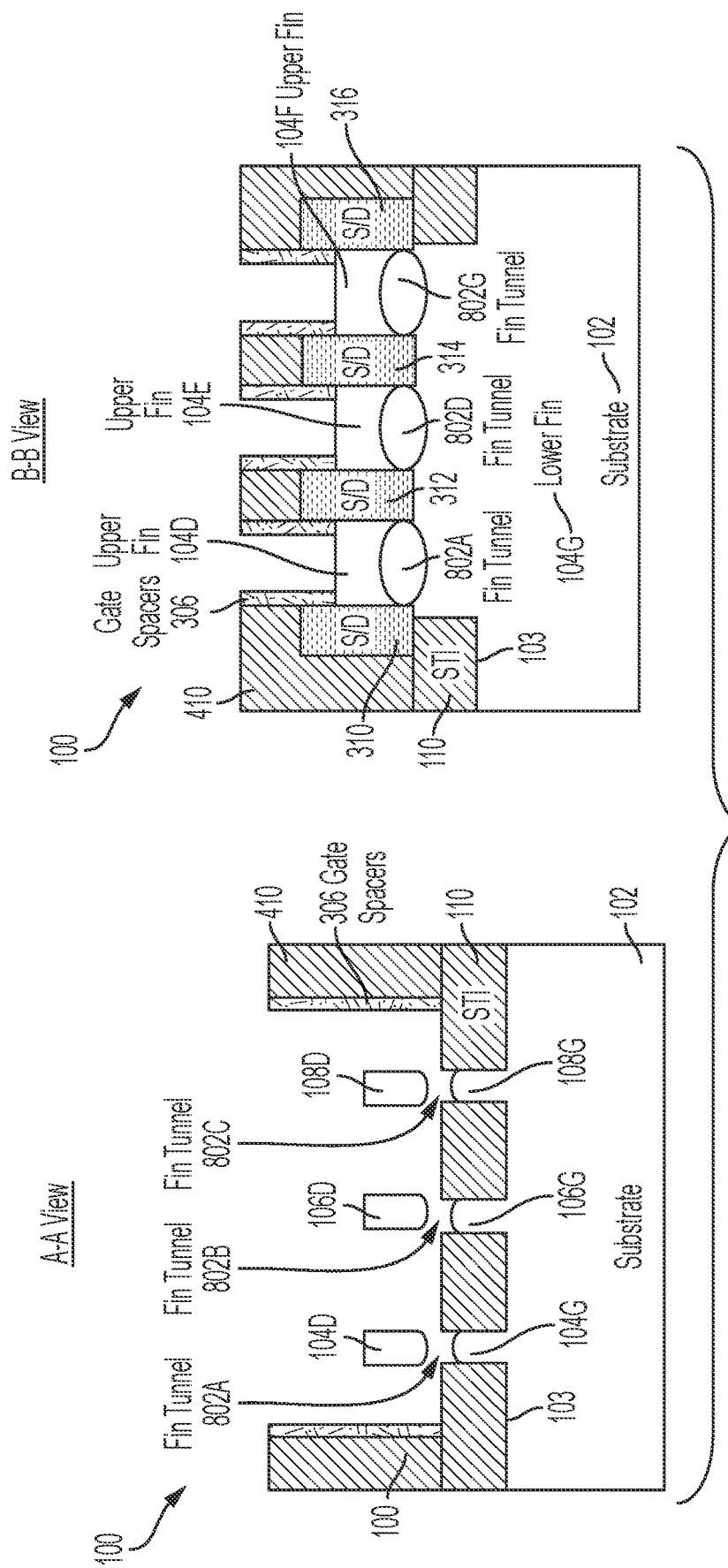

FIG. 9 depicts views along lines A-A and B-B of the IC 100 after additional fabrication operations in accordance with aspects of the invention. As best shown in the A-A and B-B views, and in accordance with aspects of the invention, known semiconductor fabrication operations (e.g., selective etching) have been used to remove the remaining segments of the hat mask 602 (shown in FIG. 8).

Figure 10:
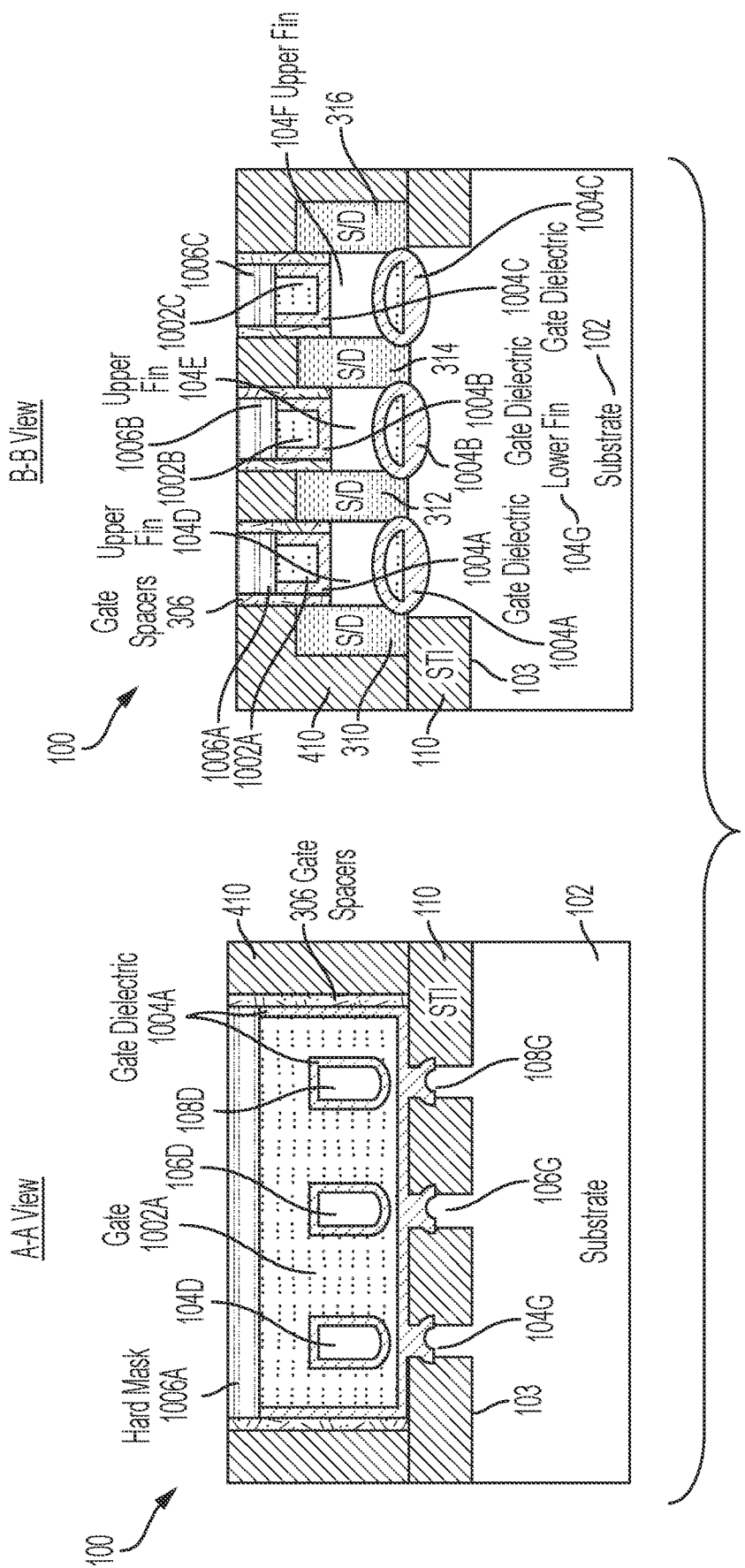

FIG. 10 depicts views along lines A-A and B-B of the IC 100 after additional fabrication operations in accordance with aspects of the invention. As best shown in the A-A and B-B views, and in accordance with aspects of the invention, known semiconductor fabrication operations (e.g., RMG processes) have been used to form gate structures that include conductive gates 1002A, 1002B, 1002C, gate dielectrics 1004A, 1004B, 1004C, and optional gate hard masks 1006A, 1006B, 1006C. Referring specifically to the A-A view of FIG. 10, the gate dielectric 1004A and the gate 1002A fill the fin tunnels fin tunnels 802A, 802B, 802C and wrap around the active upper fins 104D, 106D, 108D.

As best shown in the B-B cross-sectional view of FIG. 10, the IC 100 depicts one end of the previously described three transistors coupled in series and having shared S/D regions. More specifically, the leftmost transistor is the conductive gate 1002A, the gate dielectric 1004A, the S/D regions 310, 312, and the active upper fin (active channel) 104D; the central transistor is the conductive gate 1002B, the gate dielectric 1004B, the S/D regions 312, 314, and the active upper fin (active channel) 104E; and the rightmost transistor is the conductive gate 1002C, the gate dielectric 1004C, the S/D regions 314, 316, and the active upper fin 104F (active channel). The leftmost transistor shares S/D region 312 with the central transistor and the rightmost transistor shares the S/D region 314 with the central transistor. Additional active upper fins (formed from fins 106, 108 (shown in FIG. 2)) are positioned behind the active upper fins 104D, 104E, 104F.

The A-A cross-sectional view of FIG. 10 depicts a portion of the leftmost transistor shown in the B-B view of FIG. 10. The leftmost transistor includes the conductive gate 1002A, the gate dielectric 1004A, and the active upper fins (active channels) 104D, 106D, 108D. Accordingly, the leftmost transistor includes three (3) elongated, high aspect-ratio channel regions 104D, 106D, 108D, and the conductive gate 1002A and the gate dielectric 1004A completely surround a top surface, a bottom surface and sidewall surfaces of each of the elongated, high aspect-ratio channel regions 104D, 106D, 108D. Because each of the multiple active upper fin channels 104D, 106D, 108D is elongated and has a high aspect-ratio (i.e., a fin cross-section is taller than it is wide), and because the gate structure 1002A, 1004A is over and around a top surface, a bottom surface, and sidewalls of each of the multiple active upper fin channels 104D, 106D, 108D, electrical conductivity of the channel regions formed by the multiple active upper fin regions 104D, 106D, 108D is increased. The central transistor and the rightmost transistor shown in the B-B view of FIG. 10 have substantially the same construction as the leftmost transistor shown in the A-A view of FIG. 10.

In aspects of the invention, the gate dielectric 1004A can be a high-k dielectric material, e.g., hafnium-based material, and can be deposited using known atomic layer deposition (ALD) processes. "High-k" generally stands for high dielectric constant, which is a measure of how much charge a material can hold. Air is the reference point for this constant and has a "k" of 1.0. $SiO_2$ has a "k" of 3.9, and "high-k" materials, such as hafnium dioxide ($HfO_2$), zirconium dioxide ($ZrO_2$) and titanium dioxide ($TiO_2$) have "k" values higher than 3.9. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

The gate metal 1002A can include a metal liner, e.g., a work-function metal, deposited on the gate dielectric 1004A and a gate metal deposited on the metal liner to complete the gate structure. In embodiments of the invention, the metal liner can be, for example, TiN or TaN, and the gate metal can be aluminum or tungsten. A planarization process (e.g., CMP) is applied after formation of the gate dielectric 1004A and the gate metal 1002A to planarize the IC 100. In some aspects of the invention, the conductive gate 1002A and the gate dielectric 1004A can be recessed using known fabrication operations, and an optional gate hard mask 1006A can be deposited over the recessed gate dielectric 1004A and conductive gate 1002A. In embodiments of the invention, the optional hard mask 1006A can be formed from a nitride or an oxide layer.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor-based structure comprising:
a fin formed over a substrate;
a fin tunnel formed through the fin to define an upper fin region and a lower fin region spaced-apart from the upper fin region; and
a gate structure configured to wrap around a circumference of the upper fin region.

2. The semiconductor-based structure of claim 1, wherein the upper fin region is physically coupled to the lower fin region.

3. The semiconductor-based structure of claim 1, wherein the circumference of the upper fin region comprises a top surface, a bottom surface, a first sidewall, and a second sidewall of the upper fin region.

4. The semiconductor-based structure of claim 1, wherein a portion of the gate structure is within the fin tunnel.

5. The semiconductor-based structure of claim 1, wherein the gate structure comprises a gate dielectric and a conductive gate material.

6. The semiconductor-based structure of claim 5, wherein the gate dielectric is on a top surface, a bottom surface, a first sidewall, and a second sidewall of the upper fin region.

7. The semiconductor-based structure of claim 6, wherein the conductive gate material is on the gate dielectric.

8. The semiconductor-based structure of claim 7, wherein the gate dielectric comprises a high-k dielectric.

9. The semiconductor-based structure of claim 1, wherein isolation regions cover sidewalls of the lower fin region.

10. The semiconductor-based structure of claim 1 further comprising a first source or drain (S/D) region communicatively coupled to a first end sidewall of the upper fin region.

11. The semiconductor-based structure of claim 10 further comprising a second S/D region communicatively coupled to a second end sidewall of the upper fin region.

12. The semiconductor-based structure of claim 11, wherein the upper fin region functions as a channel region of the semiconductor-based structure.

13. A semiconductor-based structure comprising:
a first fin and a second fin formed over a substrate;
a first fin tunnel formed through the first fin to define an upper first fin region and a lower first fin region spaced-apart from the upper first fin region;
a second fin tunnel formed through the second fin to define an upper second fin region and a lower second fin region spaced-apart from the upper second fin region; and
a gate structure configured to wrap around:
a circumference of the upper first fin region; and
a circumference of the upper second fin region.

14. The semiconductor-based structure of claim 13, wherein the upper first fin region is physically coupled to the lower first fin region.

15. The semiconductor-based structure of claim 13, wherein the circumference of the upper first fin region comprises a top surface, a bottom surface, a first sidewall, and a second sidewall of the upper first fin region.

16. The semiconductor-based structure of claim 15, wherein the circumference of the upper second fin region comprises a top surface, a bottom surface, a first sidewall, and a second sidewall of the upper second fin region.

17. The semiconductor-based structure of claim 13, wherein the gate structure comprises a gate dielectric and a conductive gate material.

18. The semiconductor-based structure of claim 17, wherein the gate dielectric is on:
a top surface, a bottom surface, a first sidewall, and a second sidewall of the upper first fin region; and
a top surface, a bottom surface, a first sidewall, and a second sidewall of the upper second fin region.

19. The semiconductor-based structure of claim 18, wherein the conductive gate metal is on the gate dielectric.

20. The semiconductor-based structure of claim 13 further comprising:
a first source or drain (S/D) region communicatively coupled to:
a first end sidewall of the upper first fin region; and
a first end sidewall of the upper second fin region; and
a second S/D region communicatively coupled to:
a second end sidewall of the upper first fin region; and
a second end sidewall of the upper second fin region;
wherein the upper first fin region and the upper second fin region are channel regions of the semiconductor-based structure.

* * * * *